United States Patent
Ohsawa

(10) Patent No.: US 7,057,926 B2
(45) Date of Patent: Jun. 6, 2006

(54) SEMICONDUCTOR MEMORY AND FBC MEMORY CELL DRIVING METHOD

(75) Inventor: Takashi Ohsawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/033,708

(22) Filed: Jan. 13, 2005

(65) Prior Publication Data

US 2006/0083058 A1    Apr. 20, 2006

(30) Foreign Application Priority Data

Oct. 4, 2004    (JP) ............................. 2004-291609

(51) Int. Cl.
*G11C 11/34* (2006.01)
(52) U.S. Cl. .................. 365/177; 365/189.09
(58) Field of Classification Search ............. 365/177, 365/189.09
See application file for complete search history.

(56) References Cited

U.S. PATENT DOCUMENTS

| 6,617,651 B1 | 9/2003 | Ohsawa | |
| 6,980,461 B1 * | 12/2005 | Portmann et al. | ........... 365/149 |
| 2004/0080481 A1 * | 4/2004 | Yamazaki et al. | ............ 345/92 |
| 2005/0094334 A1 * | 5/2005 | Kitano | ......................... 361/56 |

* cited by examiner

*Primary Examiner*—Michael t. Tran
(74) *Attorney, Agent, or Firm*—Oblon, Spivak, McClelland, Maier & Neustadt, P.C.

(57) ABSTRACT

A semiconductor memory comprises a semiconductor substrate including a semiconductor film on a first insulating film; a memory cell that stores data by charging or discharging a body region formed in said semiconductor film, the memory cell including a source layer on one side of said body region and a drain layer on another side of said body region; a memory cell array in which a plurality of said memory cells are arranged in a matrix; a second insulating film provided on said body region of said memory cell; a first word line provided on said second insulating film; a bit line connected to the drain layer of said memory cell, and having a reference potential when said memory cell is in a data retaining state; a source line connected to the source layer of said memory cell, and having the reference potential; and a second word line buried in said first insulating film, and provided below said body region of said memory cell, wherein a potential $V_{BWLH}$ of said second word line when said memory cell is in the data retaining state is closer to said reference potential than a potential $V_{BWLL}$ of said second word line when a data read/write operation is executed.

20 Claims, 12 Drawing Sheets

MC

BOX---FIRST INSULATING FILM   MC---MEMORY CELL
SOI---SEMICONDUCTOR FILM   GI---SECOND INSULATING FILM
10---SEMICONDUCTOR SUBSTRATE   WL---FIRST WORD LINE
FB---BODY REGION   BL---BIT LINE
S---SOURCE LAYER   SL---SOURCE LINE
D---DRAIN LAYER   BWL---SECOND WORD LINE

SEMICONDUCTOR MEMORY AND FBC MEMORY CELL DRIVING METHOD

CROSS-REFERENCE TO RELATED APPLICATION

This application is based upon and claims the benefit of priority from the prior Japanese Patent Application No. 2004-291609, filed on Oct. 4, 2004, the entire contents of which are incorporated herein by reference.

BACKGROUND OF THE INVENTION

1. Field of the Invention

The present invention relates to a semiconductor memory and an FBC memory cell driving method.

2. Related Art

Development of a floating body cell (FBC) memory is underway as a memory in place of a dynamic random-access memory (DRAM). Further, following scale-down of a size of an element, a double-gate full-depletion FBC (hereinafter, "FD-FBC") memory has been developed. The FD-FBC memory includes a body region in a floating state formed in a semiconductor on insulator (SOI) substrate, a source layer on one side of said body region and a drain layer on another side of said body region, a front gate electrode provided on a gate insulating film formed on the body region, and a back gate electrode buried in a buried oxide (BOX) layer.

The FD-FBC memory is equal to a partial-depletion FBC (hereinafter, "PD-FBC") memory in that data "1" or "0" can be stored by storing or emitting holes in this body region. The FD-FBC memory differs from the PD-FBC memory in the following respect. As for the PD-FBC memory, a factor that determines a threshold voltage of the body region is an impurity concentration of the body region. As for the FD-FBC memory, a factor that determines a threshold voltage of the body region is an influence of electric fields of the front gate electrode and the back gate electrode on a channel surface. In other words, in the FD-FBC memory, the back gate electrode is biased to a sufficiently negative potential to retain data. A potential well is thereby formed, and holes are stored in the body region. The FD-FBC memory does not, therefore, need to introduce impurities into the body region and the body region may consist of an intrinsic semiconductor. In the FD-FBC, a scale of an element can be scaled down while a threshold voltage difference ΔVth between data "1" and data "0" is kept large by making a thickness of the SOI layer small. Further, in the FD-FBC, a fluctuation in a threshold voltage of a memory cell resulting from an irregularity of impurity concentration in the body region can be reduced.

However, if the thickness of the SOI layer is made smaller as the element is smaller in size, a potential applied to the back gate electrode needs to be a high negative potential so as to keep a state in which the holes are stored in the body region (a state of data "1"). A field intensity between the back gate electrode and the body region is higher, accordingly. This field intensity acts to store holes in the body region in a state in which no hole is stored (a state of data "0"). As a result, a data retention related disadvantage occurs that a data "0" retaining capability is deteriorated. It is, therefore, desired to provide a semiconductor memory that can suppress a deterioration in a data retaining capability and that can be made sufficiently small in size.

SUMMARY OF THE INVENTION

A semiconductor memory according to an embodiment of the present invention comprises a semiconductor substrate including a semiconductor film on a first insulating film; a memory cell that stores data by charging or discharging a body region formed in said semiconductor film, the memory cell including a source layer on one side of said body region and a drain layer on another side of said body region; a memory cell array in which a plurality of said memory cells are arranged in a matrix; a second insulating film provided on said body region of said memory cell; a first word line provided on said second insulating film; a bit line connected to the drain layer of said memory cell, and having a reference potential when said memory cell is in a data retaining state; a source line connected to the source layer of said memory cell, and having the reference potential; and a second word line buried in said first insulating film, and provided below said body region of said memory cell, wherein a potential $V_{BWLH}$ of said second word line when said memory cell is in the data retaining state is closer to said reference potential than a potential $V_{BWLL}$ of said second word line when a data read/write operation is executed.

A semiconductor memory according to another embodiment of the present invention comprises a semiconductor substrate including a semiconductor film on a first insulating film; a memory cell that stores data by charging or discharging a body region formed in said semiconductor film, the memory cell including a source layer on one side of said body region and a drain layer on another side of said body region; a memory cell array in which a plurality of said memory cells are arranged in a matrix; a second insulating film provided on said body region of said memory cell; a word line provided on said second insulating film; a bit line connected to the drain layer of said memory cell, and having a reference potential when said memory cell is in a data retaining state; a source line connected to the source layer of said memory cell, and having the reference potential; and a back gate electrode buried in the first insulating film, the back gate electrode being provided below the body region to spread over a plurality of the word lines and a plurality of the bit lines, wherein a potential $V_{BWLH}$ of the back gate electrode when memory cells on the back gate electrode are in the data retaining state is closer to said reference potential than a potential $V_{BWLL}$ of the back gate electrode when the data read/write operation is executed on one of memory cells located over the back gate electrode.

A driving method of an FBC memory cell according to another embodiment of the present invention, the FBC memory cell comprising a body region formed in a SOI layer; a front gate electrode provided on a first insulating film formed on the body region; a back gate electrode buried in a second insulating film below the body region; a source layer formed on one side of said body region and a drain layer formed on another side of said body region;

the driving method comprises changing the potential of the back gate electrode to $V_{BWLL}$, when the FBC memory cell is in a data read/write operating state; and changing the potential of the back gate electrode to $V_{BWLH}$, closer to a reference potential than a potential $V_{BWLL}$, when the FBC memory cell is in a data retaining state, the reference potential being a potential of the source or drain layer.

DETAILED DESCRIPTION OF THE INVENTION

Embodiments of the present invention will be described hereinafter with reference to the drawings. It should be noted, however, that the embodiments are not intended to limit the present invention.

FIRST EMBODIMENT

Figure 1:
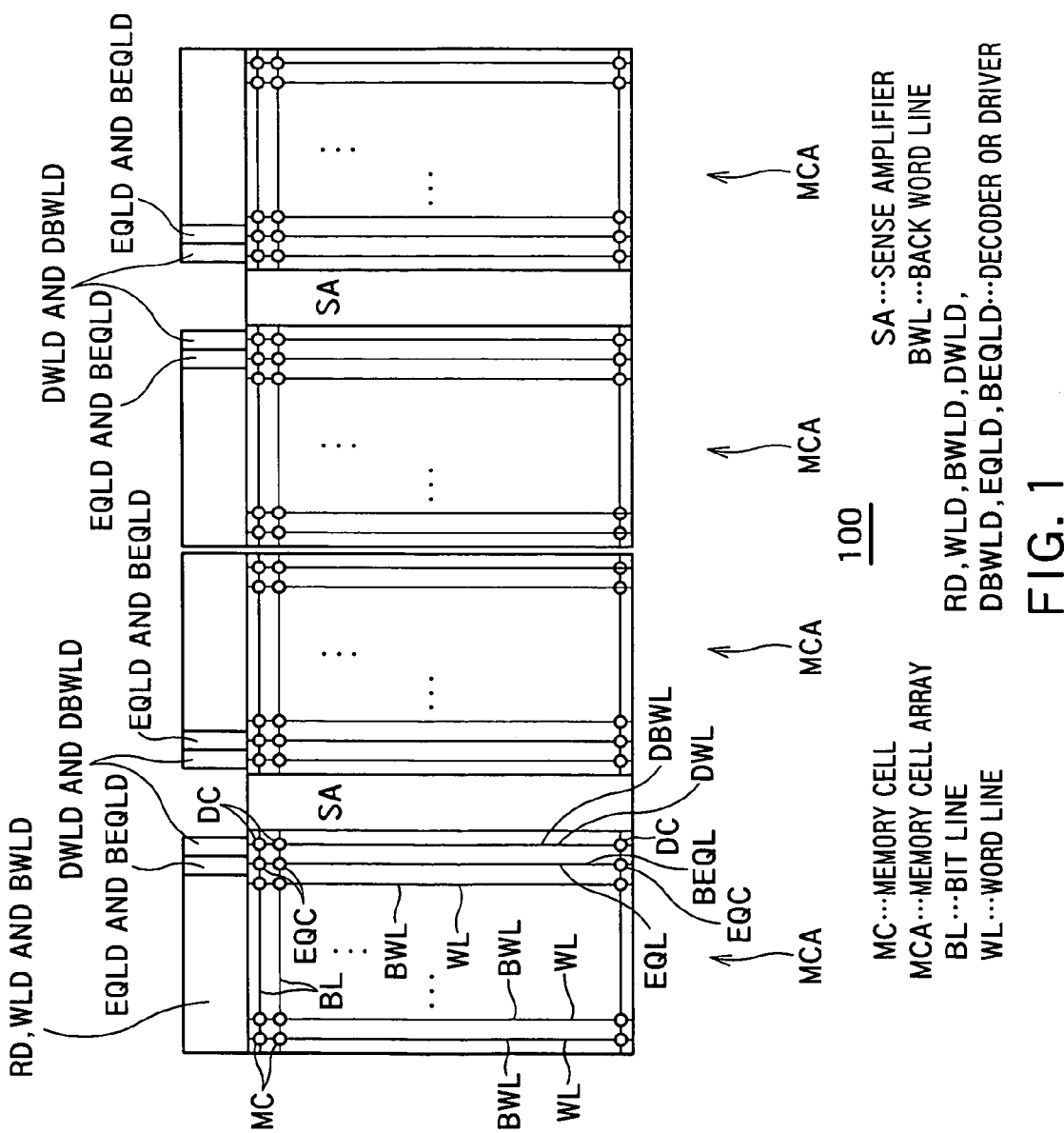
FIG. 1 is a plan view of a memory section 100 included in a semiconductor memory according to a first embodiment of the present invention.

FIG. 1 is a plan view of a memory section 100 included in a semiconductor memory according to a first embodiment of the present invention. The memory section 100 includes memory cell arrays MCA's in each of which a plurality of memory cells MC's arranged in a matrix. The memory cell MC is, for example, an FBC memory cell. In FIG. 1, four memory cell arrays MCA's are shown. Each memory cell array MCA includes a word line WL and a back word line BWL provided in each row and a bit line provided in each column. The memory array MCA includes a row decoder RD, a word line driver WLD, and a back word line driver BWLD irrespective of one another. It is assumed herein that a direction away from a sense amplifier SA is a column direction, and that a direction parallel to the sense amplifier SA is a row direction.

Furthermore, each memory cell array MCA includes dummy cells DC's, as well as a dummy word line DWL and a back dummy word line corresponding to the dummy cell DC. The dummy cell DC is equal in structure to the normal memory cell MC. An intermediate potential between a potential of data "0" and data "1" is stored in the dummy cells DC's, or data "0" and "1" are alternately written to the dummy cells DC's. If the dummy cell DC stores the intermediate potential, the dummy cell DC transmits this intermediate potential to the sense amplifier SA during data read. If the dummy cells DC's store the data "0" and data "1" alternately, the dummy cell DC to which the data "1" is written and the dummy cell DC to which the data "0" is written are short-circuited, thereby the intermediate potential between the potential of the data "0" and that of the data "1" to the sense amplifier SA. The memory cell array MCA includes a dummy word line driver DWLD and a dummy back word line driver DBWLD corresponding to the dummy word line DWL and the back dummy word line DBWL, respectively.

Further, each memory cell array MCA includes an equalizing cell EQC provided on each bit line BL and used to simultaneously set all bit lines BL at zero volt in a precharge state. The memory cell array MAC further includes an equalizing line EQL and a back equalizing line BEQL corresponding to the equalizing cell EQC. The equalizing cell EQC may be equal in configuration to the memory cell MC.

The sense amplifier SA is common to two memory cell arrays MCA's located left and right of the sense amplifier SA. The sense amplifier SA is connected to the bit lines BL's in the left and right memory cell arrays MCA's. The sense amplifier SA receives the intermediate potential between the potential of the data "0" and that of the data "1" from the dummy cell DC provided in one of the left and right memory cells MCA's as a reference potential. The sense amplifier SA also receives a potential (potential of the data "0" or "1") based on the data stored in the memory cell provided in the other memory cell MCA. Further, the sense amplifier SA compares the reference potential with the potential of each memory cell MC, and detects whether the data stored in this memory cell MC is "0" or "1". Namely, the memory section 100 adopts an open bit line scheme.

Figure 2:
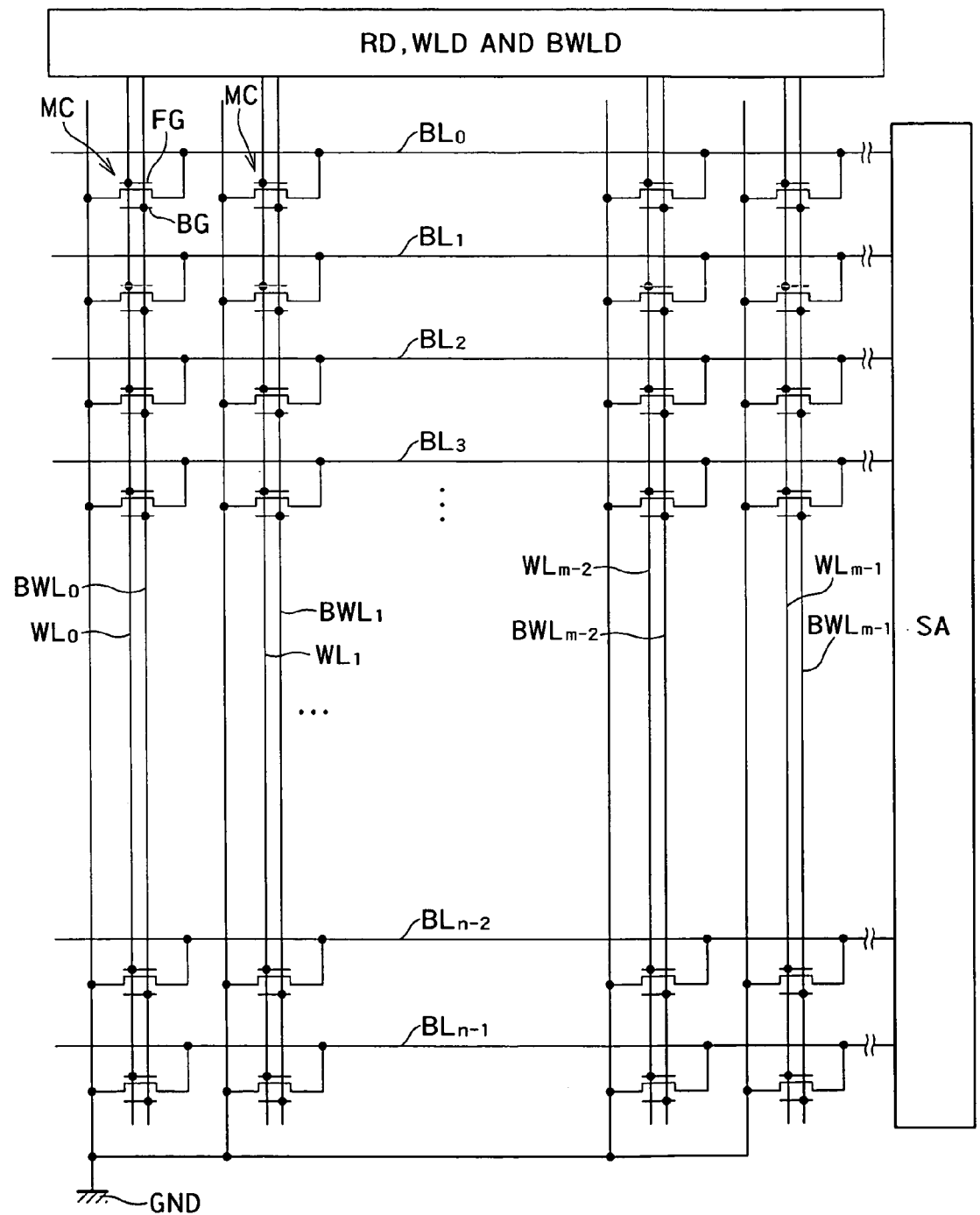
FIG. 2 is a circuit diagram that depicts a configuration of the memory cell array MCA.

FIG. 2 is a circuit diagram that depicts a configuration of the memory cell array MCA according to the first embodiment. In FIG. 2, the dummy cell DC, the equalizer cell EQC, and a driver corresponding to the dummy cell DC and the equalizer cell EQC are not shown. The memory cell array MCA includes m×n memory cells arranged in a matrix, n bit lines BL0 to BLn−1, m word lines WL0 to WLm−1 serving as first word lines, and m back word lines BWL0 to BWLm−1 serving as second word lines. The back word lines BLW0 to BLWm−1 extend in parallel to the word lines WL0 to WLm−1. The bit lines BL0 to BLn−1 are orthogonal to the word lines WL0 to WLm−1.

Each memory cell MC is a double-gate transistor. Therefore, the memory cell MC includes a front gate electrode FG connected to one of the word lines WL0 to WLm−1, and a back gate electrode BG connected to one of the back word lines BWL0 to BWLm−1. A drain of the memory cell MC is connected to one of the bit lines BL0 to BLn−1. Sources of the respective memory cells MC's are connected to a reference potential GND (e.g., zero volt) in common.

Figure 3:
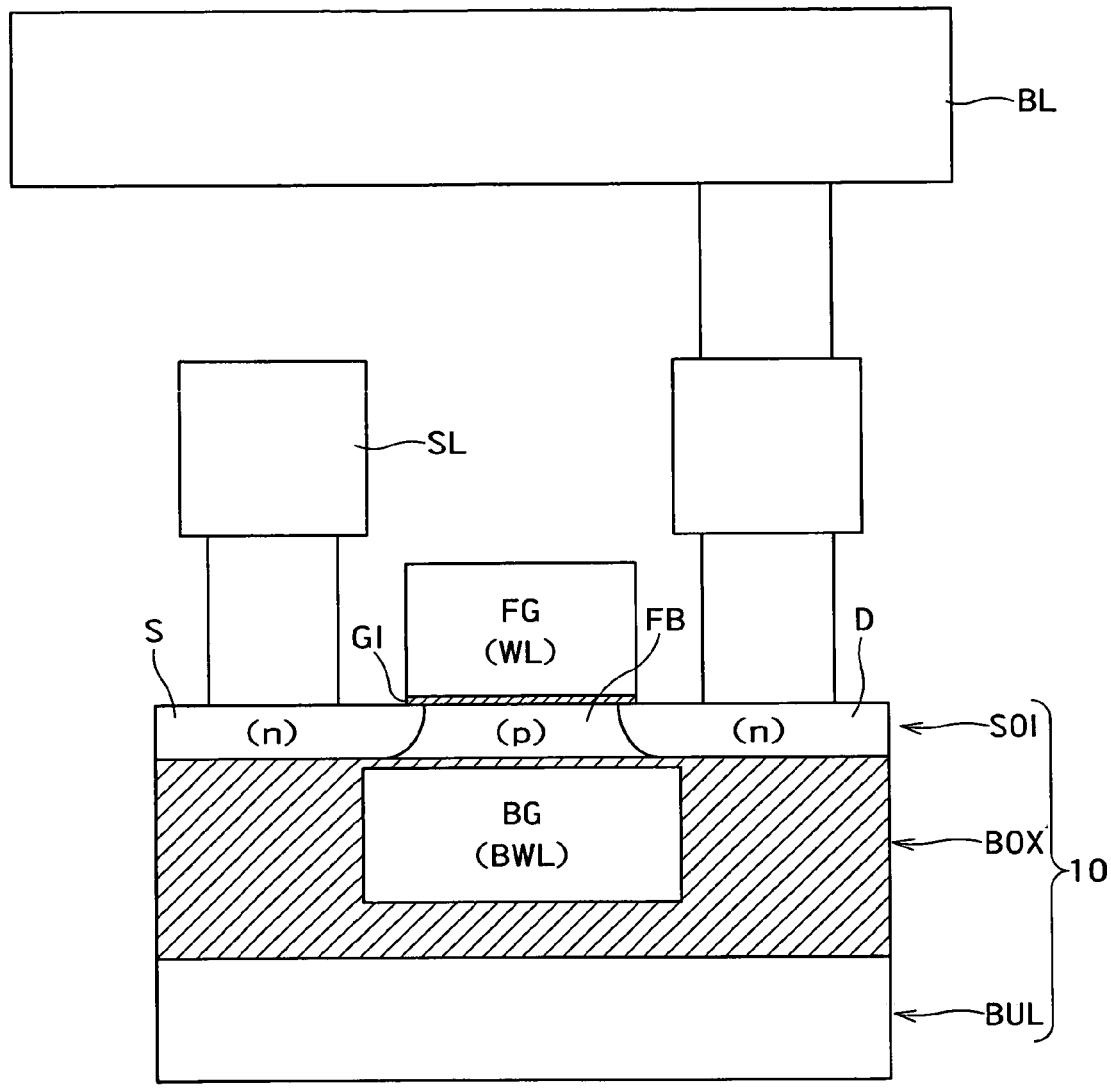
FIG. 3 is a cross-sectional view that depicts that one of the memory cells MC's is cut along the bit line BL.

FIG. 3 is a cross-sectional view that depicts one of the memory cells MC's which is cut along the bit line BL. A semiconductor substrate 10 includes a bulk BUL consisting of a semiconductor material, a first insulating film BOX consisting of an insulator, and a semiconductor film SOI consisting of the semiconductor material. The memory cell MC includes a p-type body region FB, an n-type source layer S, an n-type drain layer D, a second insulating film GI, a front gate FG (first word line WL), and a back gate BG (second word line BWL).

The semiconductor material is, for example, silicon. The body region FB is formed in the semiconductor film SOI. The body region FB is electrically insulated from the source layer S, the drain layer D, the front gate FG, and the back gate BG. The body region FB consists of a p-type semiconductor at a low impurity concentration. The semiconductor may be an intrinsic semiconductor.

The source layer S is provided in the semiconductor film SOI on a side of the body region FB. The drain layer D is provided in the semiconductor film SOI on another side of the body region FB. The second insulating film GI is provided on the body region FB. The front gate FG is provided on the second insulating film GI. The second word line BWL is buried in the first insulating film BOX, and provided below the body region FB. The second word line BWL consists of, for example, doped polysilicon.

The drain layer D is electrically connected to the bit line BL. The source layer S is electrically connected to the source line SL extending in parallel to the gates FG and BG (word lines WL and BWL).

Figure 4:
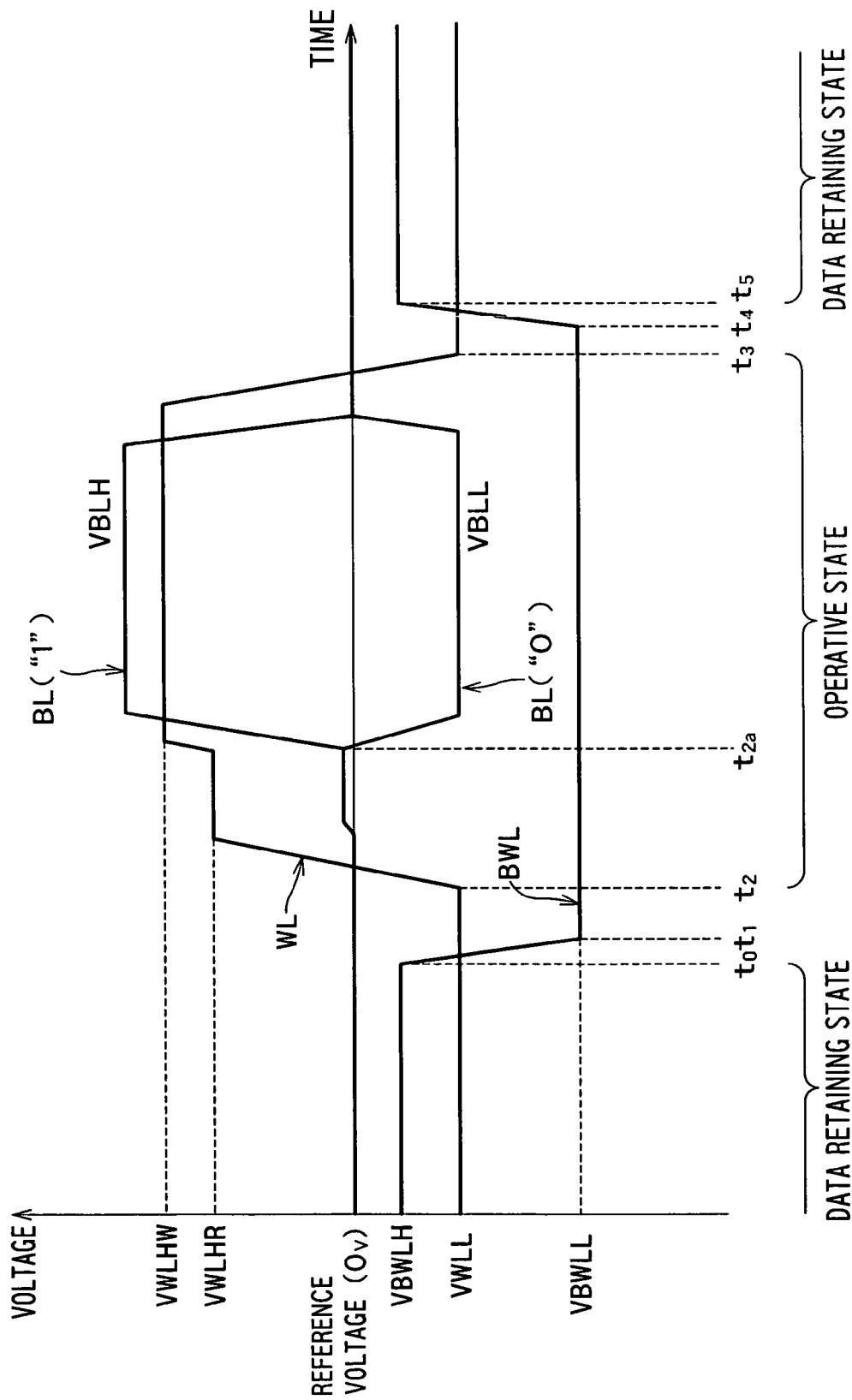
FIG. 4 is a graph that depicts changes in potentials of the bit line BL, the word line WL, and the back word line BWL, respectively.

FIG. 4 is a graph that depicts changes in potentials of the bit line BL, the word line WL, and the back word line BWL, respectively. When the memory cell array MCA is in a data retaining state, potentials of the bit line BL and the source line SL are both the ground potential GND (zero bolt), and a potential of the word line WL is a data retaining potential $V_{WLL}$. At this time, a potential of the back word line BWL is a data retaining potential $V_{BWLH}$.

When the memory cell array MCA turns into an operative state, the back word line BWL first falls from the potential $V_{BWLH}$ to the potential $V_{BWLL}$ (at times t0 to t1). Next, the word line WL rises from the data retaining potential $V_{WLL}$ to a read potential $V_{WLHR}$ (at a time t2). When the word line WL has the potential $V_{WLHR}$, data is read from the memory cell MC (at times t2 to t2a). If the data "1" is to be read, the bit line BL rises to a potential $V_{BLH}$. If the data "0" is to be read, the bit line BL falls to a potential $V_{BLL}$. The sense amplifier SA detects the data of the memory cell MC based on the potential of the bit line BL.

If data is to be written to the memory cell MC, the word line WL rises to a write potential $V_{WLHW}$. If the data "1" is to be written, the bit line BL rises to the potential $V_{BLH}$. If the data "0" is to be written, the bit line BL falls to the potential $V_{BLL}$. The data is thereby written to the memory cell MC.

If this data read/write operation is to be executed, the potential of the back word line BWL is kept at a potential $V_{BWLL}$ that is further from the reference potential (e.g., zero volt) than the potential $V_{BWLH}$. In this embodiment, since both the potentials $V_{BWLH}$ and $V_{BWLL}$ are negative, the potential $V_{BWLL}$ is lower than the potential $V_{BWLH}$.

Thereafter, when an access to the memory cell MC connected to the word line WL is completed, the word line WL returns to the data retaining potential $V_{WLL}$ (at a time t3). The back word line BWL then returns to the potential $V_{BWLH}$ closer to the reference potential than the potential $V_{BWLL}$ (at times t4 to t5).

A principle of an operation of the FD-FBC memory will be described. Normally, in order for the n-type FBC memory cell to retain the data "1", it is necessary to set the potential of the body region lower (deeper) than that of the source and drain regions. By so setting, holes generated by impact ionization can be stored in the body region.

As for the PD-FBC memory, the body region is a p-type at relatively high impurity concentration. Therefore, the potential of the body region is sufficiently deeper than that of the n-type source and drain regions.

As for the FD-FBC memory, by contrast, the semiconductor film SOI is thin and/or p-type impurities in the body region have a low concentration. Therefore, the potential of the body region cannot be set sufficiently deeper than that of the source and drain regions. As a result, the holes in the body region FB cannot stay in the body region FB but escape into the source and drain regions.

Considering this, a negative voltage with a large absolute value is applied from the back gate BG to the body region FB, thereby setting the potential of the body region FB lower than that of the source and drain regions. By so setting, the holes can stay in the body region FB. Namely, the memory cell MC can retain the data "1".

In this embodiment, when the memory cell array MCA is in the data retaining state, the back word line BWL is caused to rise to the potential $V_{BWLH}$ higher (closer to the reference potential) than the potential $V_{BWLL}$. Since this operation lowers potential barriers of both ends of the body region FB, there is a fear that the holes are emitted into the source and drain regions.

However, according to this embodiment, when the memory cell array MCA is in the data retaining state, both the potentials $V_{WLL}$ and the potential $V_{BWLH}$ are lower than the reference potential (e.g., zero volt). Owing to this, even if the back word line BWL is set at the potential $V_{BWLH}$, the holes only move from the back gate BG side (the back word line BWL side) in the body region FB to the front gate FG side (the word line WL side). Therefore, even if the back word line BWL is driven according to this embodiment, the holes do not escape into the source and drain regions and the memory cell MC can continuously retain the data "1".

A data retaining capability of retaining the data "0" will be described. As shown in FIG. 4, in the data retaining state, the potential of the source and drain regions is the reference potential. The potentials of the word line WL and the back word line BWL are the potentials $W_{WLL}$ and $V_{BWLH}$ both lower than the reference potential. A pn-junction between the source-drain regions and each of the word lines WL, BWL is reversely biased. A leak current due to the pn-junction acts to increase the holes in the body region FB. Likewise, a leak current due to gate induced drain leakage ("GIDL") acts to increase the holes in the body region FB. In the data retaining state, therefore, state of the data "1" in which the holes are stored is not changed to that of the data "0". On the other hand, in the data retaining state, the state of the data "0" in which the holes are emitted is gradually changed to that of the data "1". In other words, a data retaining time depends on a duration of the state (the state of the data "0") in which the holes (minority carriers) are fewer in the body region FB.

To enhance the data "0" retaining capability (that is, maintain the data "0" retaining state for a longer time) in the data retaining state, it is effective to suppress an electrical field intensity in the body region FB to be low. Generally, in order to scale down the size of the FD-FBC memory while keeping threshold voltages of the data "1" and the data "0" constant, it is necessary to make the semiconductor film SOI and the second insulating film GI thin. To keep a leak current of GIDL constant, the potential of the front gate FG is preferably decreased corresponding to the size of the FD-FBC memory. On the other hand, the potential of the back gate BG needs to be set low (further from the reference potential) according to the scale-down of the size of the FD-FBC memory. According to the conventional data retaining scheme, therefore, the field intensity between the back gate BG (back word line BWL) and the body region FB is intensified if the size of the FD-FBC memory is scaled down. This means that the data "0" retaining capability is deteriorated.

According to this embodiment, by contrast, the potential $V_{BWLH}$ of the back word line BWL in the data retaining state is set closer to the reference potential than the potential $V_{BWLL}$ of the back word line BWL in the operative state. By so setting, the field intensity between the back gate BG and the body region FB is relaxed. As a result, the data "0" retaining capability is enhanced.

Figure 5:
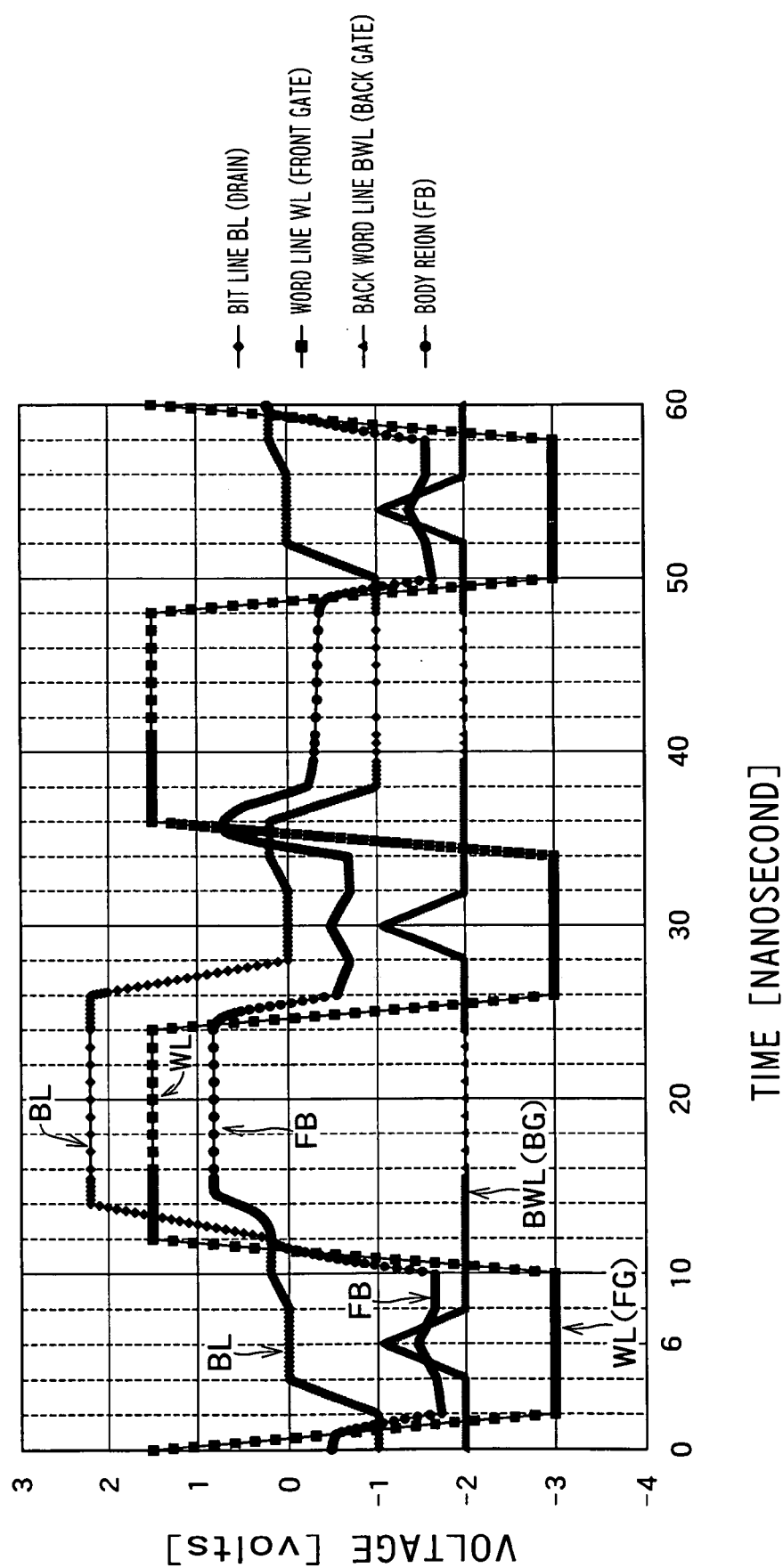
FIG. 5 is a graph that depicts a result of a simulation for verifying the operation of the FD-FBC memory cell according to this embodiment.

FIG. 5 is a graph that depicts a result of a simulation for verifying the operation of the FD-FBC memory cell according to this embodiment. It is assumed herein that a gate length Lg of the front gate FG of the memory cell MC is 150 nanometers, a thickness Tox of the second insulating film is 12 nanometers, a thickness TSi of the semiconductor film SOI is 36 nanometers, a thickness of the first insulating film BOX is 25 nanometer, an impurity concentration NA of the body region FB is $1.0*10^{17}$ $cm^{-3}$, a lowest voltage Vwll of the word line is −3 volt, a lowest voltage Vbll of the bit line is −1 volt, a lowest voltage Vbwll of the back word line (plate) is −2 volt, and a highest voltage Vbwlh of the back word line is −1 volt.

First, at a time 0, the data "0" is written to the memory cell MC. The voltage of the word line WL is reduced to −3 volt, and that of the bit line BL is increased to zero volt. The voltage of the back word line BWL is increased from −2 volt to −1 volt so as to be closer to the reference potential (0 volt) of the bit line BL. As a result, the electrical field intensity in the body region FB is relaxed (at a time of 6 nanoseconds (ns)). The time of this 6 ns is a time at which the memory cell MC is retaining the data "0".

The voltage of the back word line BWL is reduced to −2 volt, that of the bit line BL is increased to 0.2 volt, and that of the word line WL is increased to 1.5 volts (at a time of 12 ns). Therefore, the data "0" is read from the memory cell MC. After the data read, the voltage of the bit line BL is increased up to 2.2 volts (at a time of 14 ns). By doing so, the data "1" is written to the memory cell MC.

When the data "1" has been written to the memory cell MC, the voltage of the word line WL is reduced to −3 volt and that of the bit line BL is reduced to zero volt (at times of 26 to 28 ns). The memory cell MC thereby retains the data "1". At this time, the voltage of the back word line BWL is increased from −2 volt to −1 volt so as to be closer to the potential (zero volt) of the bit line BL, thereby relaxing the electrical field intensity in the body region FB (at a time of 30 ns). The time of this 30 ns is a time at which the memory cell MC is retaining the data "1".

The voltage of the back word line BWL is reduced to −2 volt, that of the bit line BL is increased to 0.2 volt, and that of the word line WL is increased to 1.5 volt (at a time of 36 ns). The data "1" is thereby read from the memory cell MC. After the data read, the voltage of the bit line BL is reduced to −1 volt (at a time of 38 ns). The data "0" is thereby written to the memory cell MC.

When the data "0" has been written to the memory cell MC, the voltage of the word line WL is returned to −3 volt and that of the bit line BL is returned to zero volt (at times of 50 to 52 ns). By doing so, the memory cell MC retains the data "0". At this time, similarly to the time of 6 ns, the electrical field intensity in the body region FB is relaxed (at a time of 54 ns). Finally, the data "0" is read from the memory cell MC.

Figure 6:
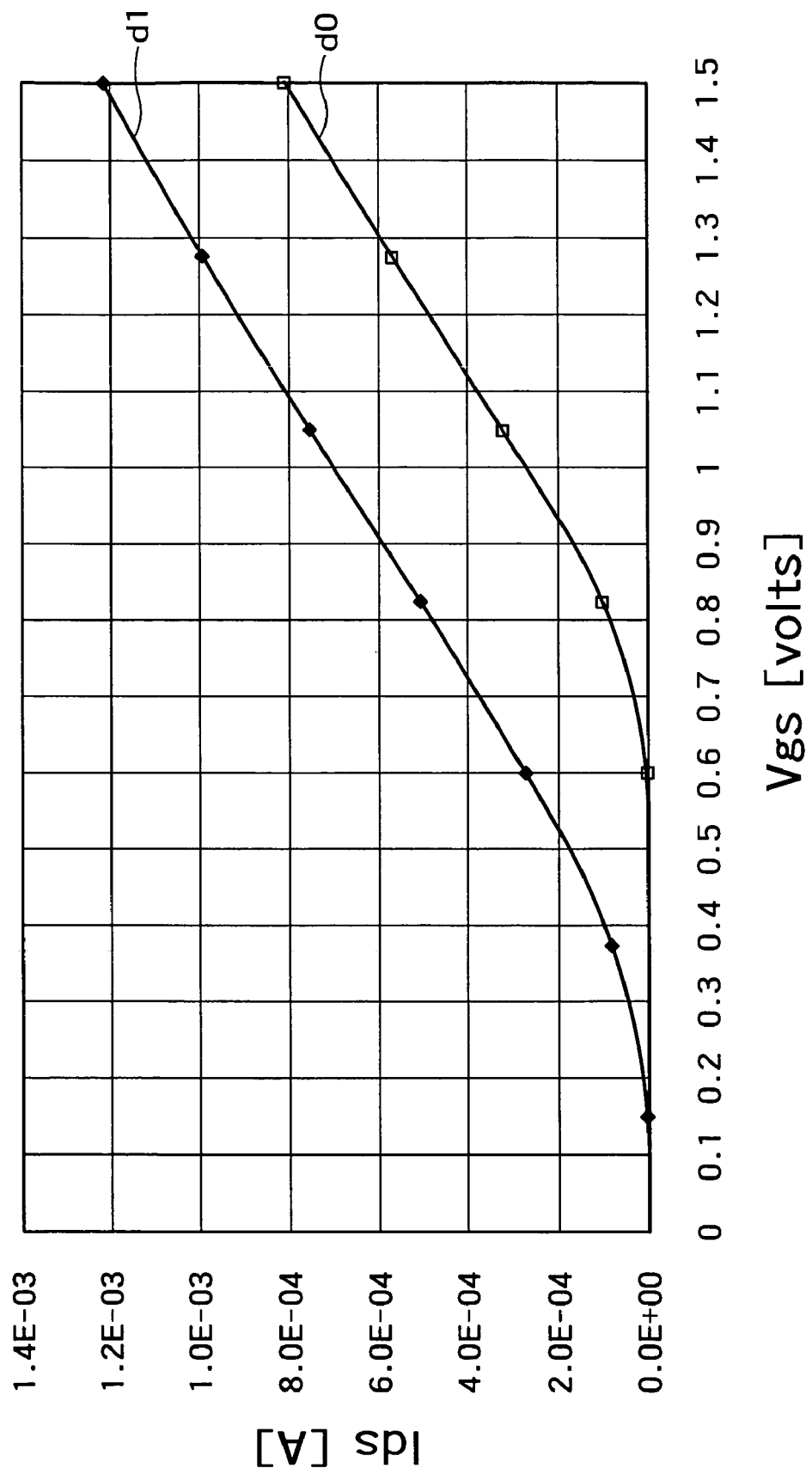
FIG. 6 is a graph that depicts a result of monitoring a data "1" signal and a data "0" signal in the series of operations shown in FIG. 5.

FIG. 6 is a graph that depicts a result of monitoring a data "1" signal and a data "0" signal in the series of operations shown in FIG. 5. In FIG. 6, a horizontal axis indicates a voltage Vgs applied to the front gate FG (WL), and a vertical axis indicates a current Ids between the source and the drain. Curve line d1 denotes a current when the data "1" is read at times of 34 to 36 ns. Curve line d0 denotes a current when the data "0" is read at times of 58 to 60 ns. As shown in the graph of FIG. 6, the threshold voltage difference ΔVth between the data "1" and the data "0" is about 0.4 volt. The value "about 0.4 volt" of the threshold voltage difference ΔVth indicates that the memory normally functions as the FBC memory.

MODIFICATION OF THE FIRST EMBODIMENT

Figure 7:
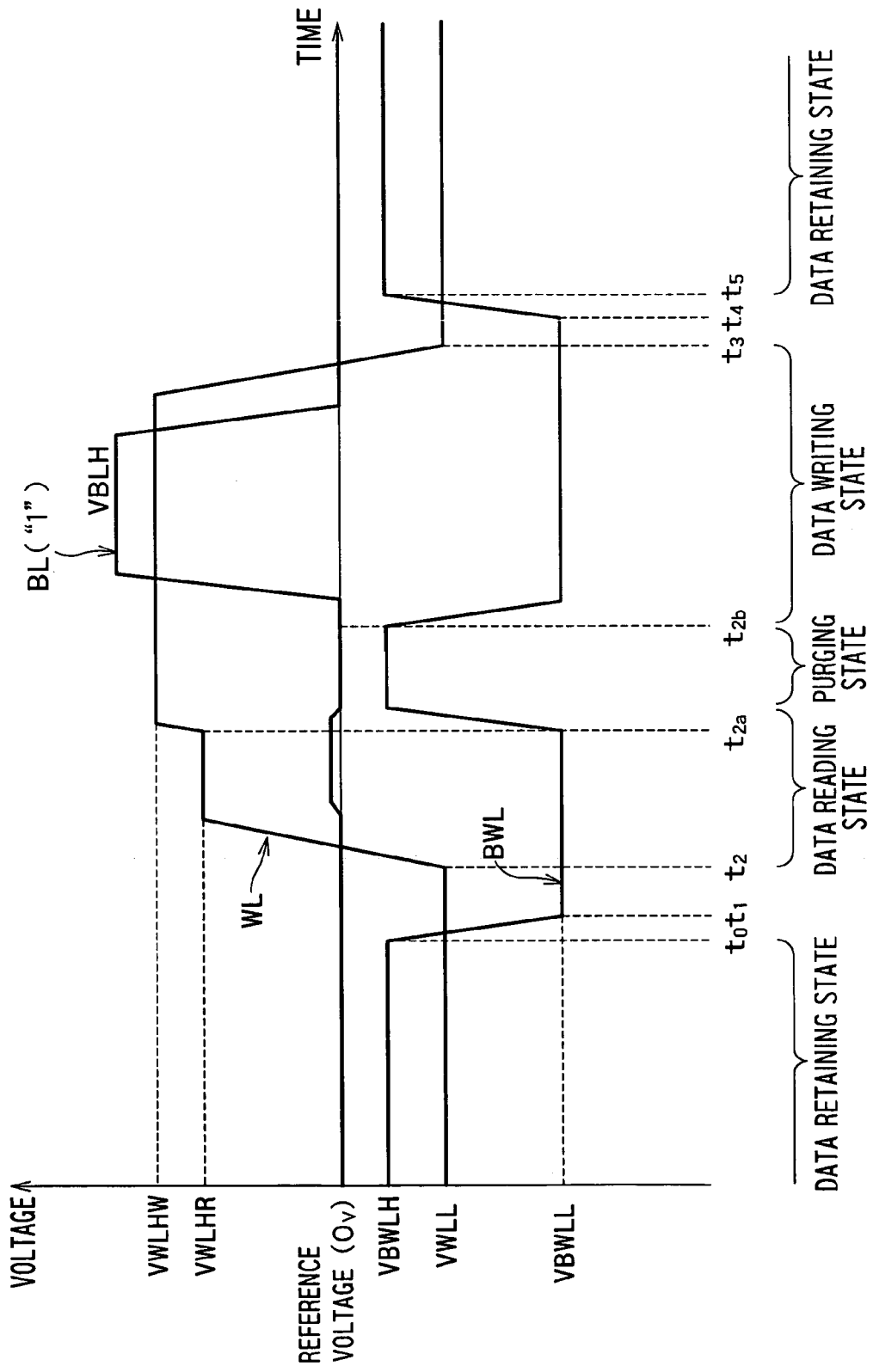
FIG. 7 is a graph that depicts changes in potentials of the bit line BL, the word line WL, and the back word line BWL according to a modification of the first embodiment.

FIG. 7 is a graph that depicts changes in potentials of the bit line BL, the word line WL, and the back word line BWL according to a modification of the first embodiment. In this modification, the data read operation up to a time t2a is equal to the operation shown in FIG. 4. After the data is read, the potential of the back word line BWL is raised to as high level as the potential $V_{BWLH}$. By thus setting the word line WL at as high potential as $V_{WLHW}$ and setting the back word line BWL at as high potential as $V_{BWLH}$, the potential of the body region FB is increased. As a result, similarly to a purge operation performed in a nonvolatile memory, the holes in the memory cell MC connected to this word line WL are temporarily emitted, and the data "1" is written only to the memory cells MC's storing the data "1" based on information on the sense amplifier SA. Thereafter, the potential of the back word line BWL is returned to the potential $V_{BWLL}$ (at a time t2b). The operation from the time t2b in this modification is also equal to the operation starting at the time t2a shown in FIG. 4.

The modification of the first embodiment can attain the same advantages as those of the first embodiment. If the holes in all the memory cells MC's along the back word line BWL are emitted, the potential of the back word line BWL is not necessarily equal to the potential $V_{BWLH}$ but may be a potential higher than the potential $V_{BWLL}$.

SECOND EMBODIMENT

Figure 8:
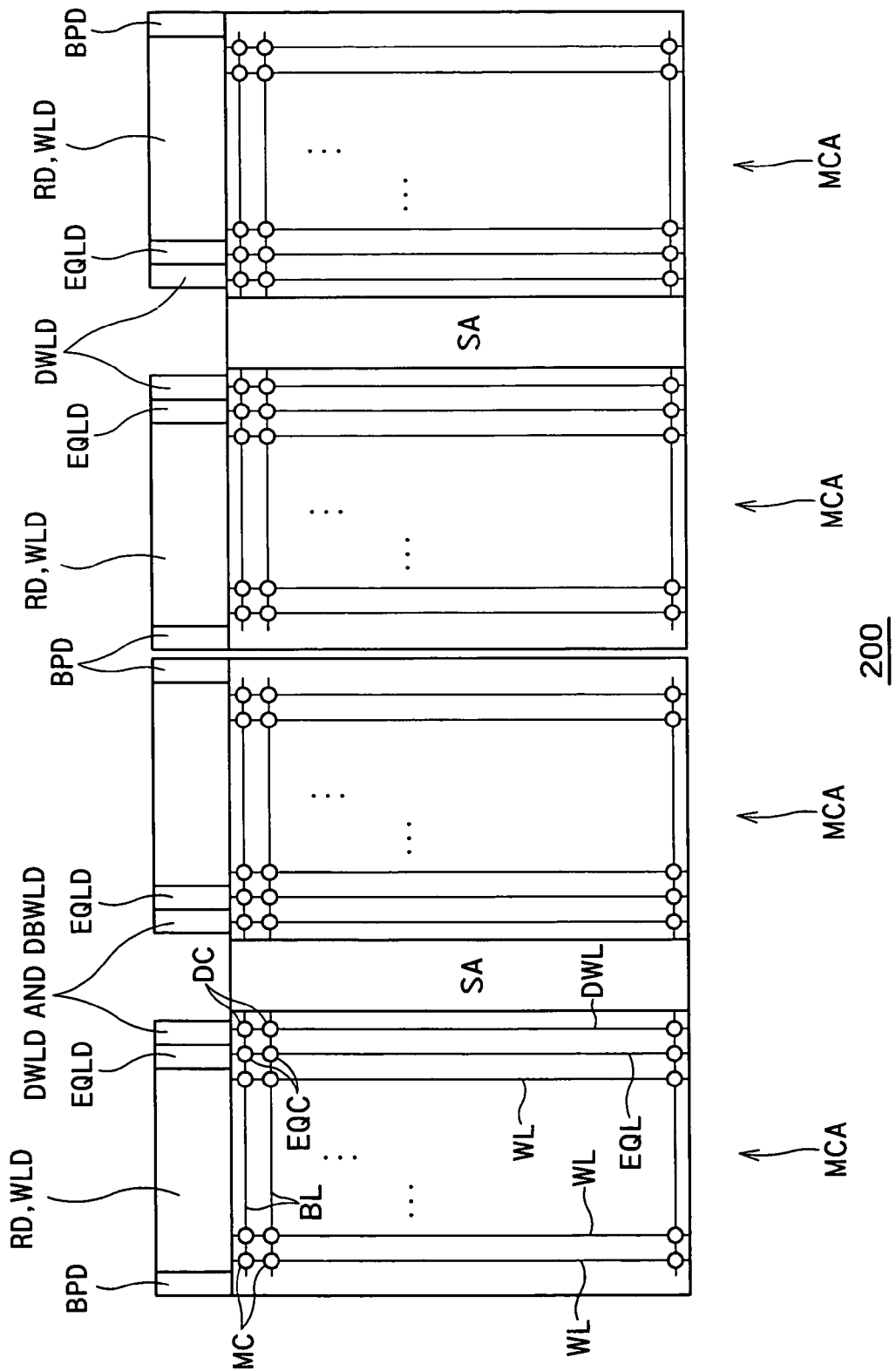
FIG. 8 is a plan view of a memory section 200 included in a semiconductor memory according to a second embodiment of the present invention.

FIG. 8 is a plan view of a memory section 200 included in a semiconductor memory according to a second embodiment of the present invention. In the first embodiment, the back word lines BWL's as many as the word lines WL's are provided to correspond to the word lines WL's. In the second embodiment, a flat back plane BP is provided as a back gate electrode. The back plane BP is provided to spread over a plurality of word lines and a plurality of bit lines. The back plane BP is provided, for example, below k*l memory cells MC's (where k is an integer equal to or greater than 2 (k>2) and l is an integer equal to or greater than 2 (l≧2)).

More specifically, according to the second embodiment, the back plane BP is provided per memory cell array MCA. Following this, a back-plane driver BPD is provided per memory cell array MCA. The other constituent elements of the memory section 200 according to the second embodiment may be same as those of the memory section 100 according to the first embodiment.

Figure 9:
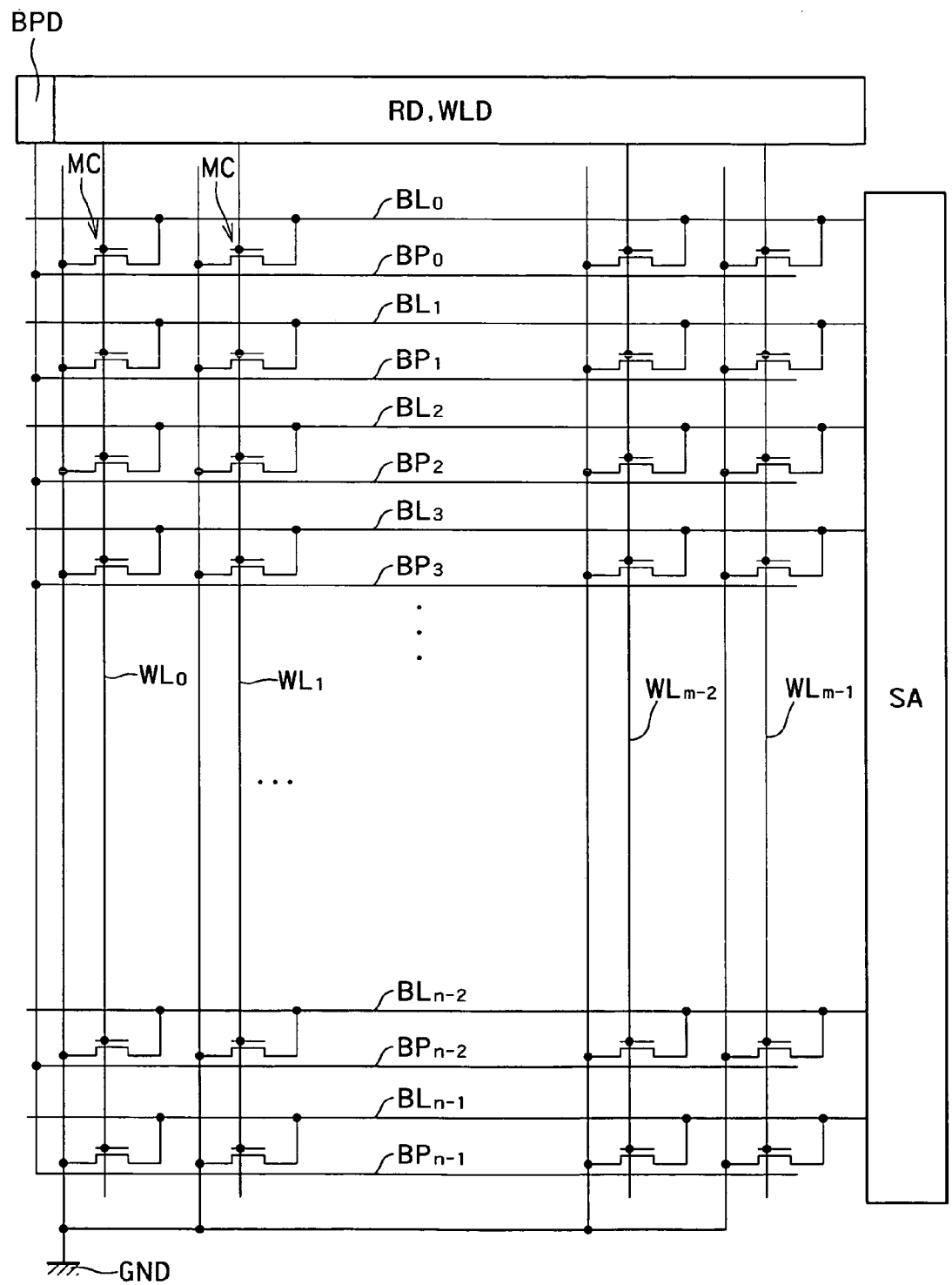
FIG. 9 is a circuit diagram that depicts a configuration of the memory cell array MCA according to the second embodiment.

FIG. 9 is a circuit diagram that depicts a configuration of the memory cell array MCA according to the second embodiment. Back gates BG's of the respective memory cells MC's in the memory cell array MCA are connected to one back gate driver BPD in common. This back gate driver BPD drives all the back gates BG in the memory cell array MCA to have an equal potential.

Figure 10:
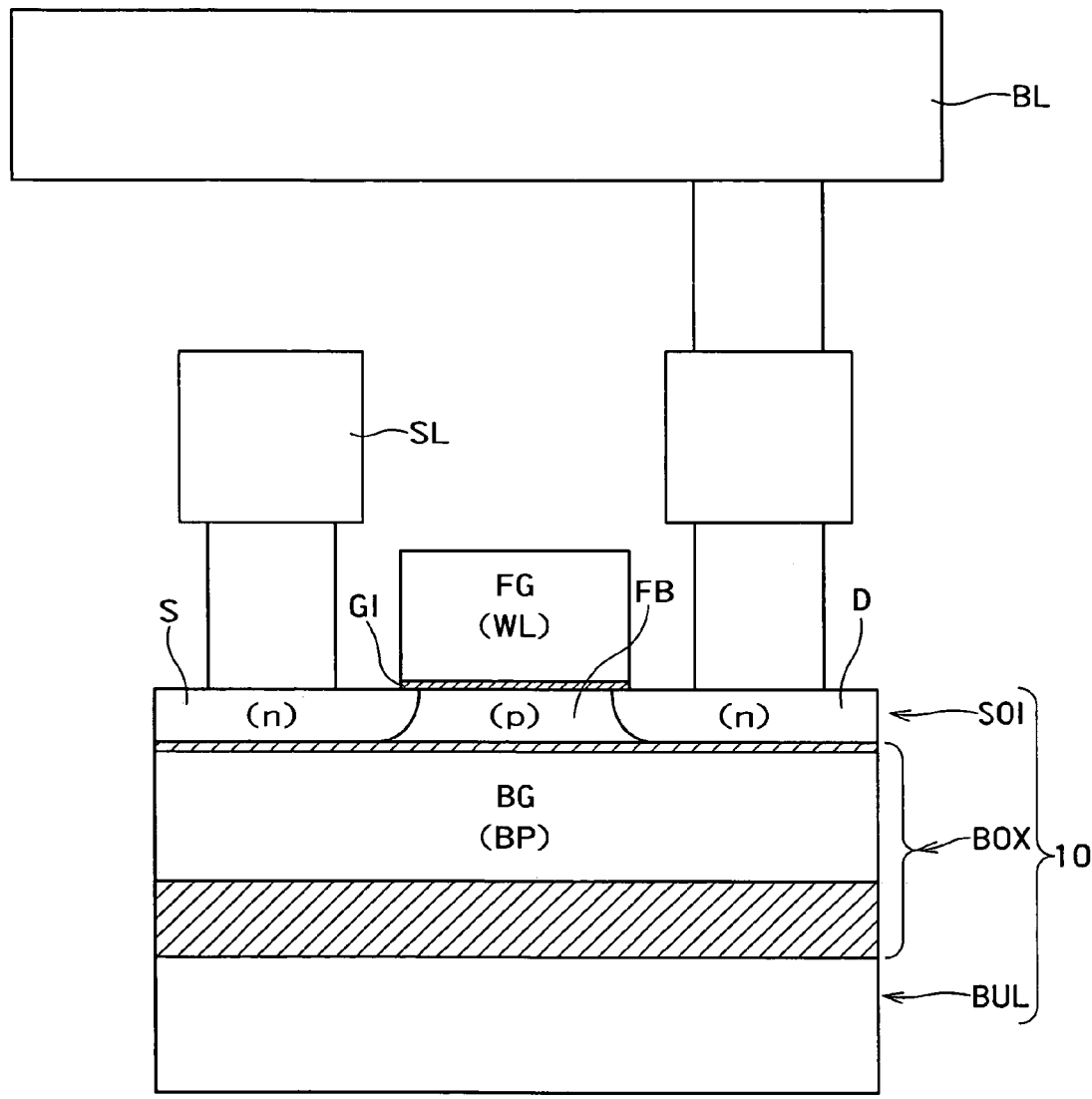
FIG. 10 is a cross-sectional view that depicts that one of the memory cells MC's according to the second embodiment is cut along the bit line BL.

FIG. 10 is a cross-sectional view that depicts one of the memory cells MC's according to the second embodiment which is cut along the bit line BL. The back plane BP is buried in the first insulating film BOX in a plane fashion. The other constituent elements of the memory cell MC according to the second embodiment may be same as those of the memory cell MC according to the first embodiment shown in FIG. 3. Further, the operation of the memory according to the second embodiment may be equal to that according to the first embodiment shown in FIG. 4. It is noted that the operation of the back plane BP according to the second embodiment corresponds to that of the back word line BWL shown in FIG. 4.

According to the second embodiment, if the entire memory cell array MCA is turned into a data retaining state, it suffices that one back-plane driver BPD drives the entire back plane BP. It is, therefore, unnecessary to provide as many drivers as the word lines, thereby making it possible to simplify a drive circuit and scale down an element size. Further, the simulation results shown in FIGS. 5 and 6 can be similarly applied to the second embodiment. The second embodiment can, therefore, exhibit the same advantages as those of the first embodiment. It is noted, however, that the potential of the back gate cannot be controlled for each row of the memory cell array MCA according to the second embodiment.

In the second embodiment, the back plane BP is provided per memory cell array MCA. Alternatively, the back plane BP may be provided to correspond to a group of several memory cells MC's in one memory cell array MCA.

MODIFICATION OF SECOND EMBODIMENT

Figure 11:
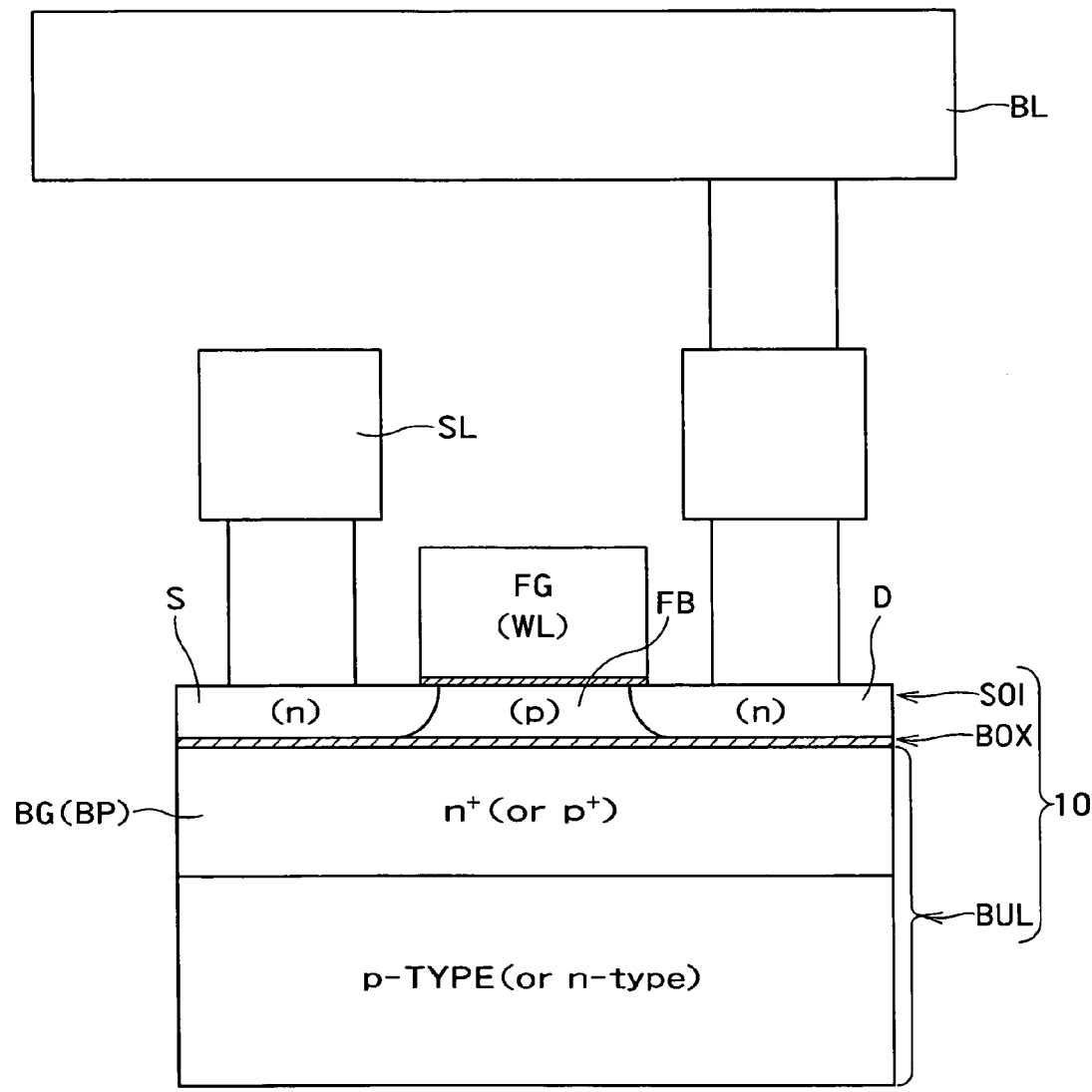
FIG. 11 is a cross-sectional view of the memory cell MC according to a modification of the second embodiment.

FIG. 11 is a cross-sectional view of the memory cell MC according to a modification of the second embodiment. According to the modification, the first insulating film BOX is made thin, and an impurity diffused layer formed in the bulk BUL below the first insulating film BOX is employed as the back plane BR The back plane BP is, for example, an $n^+$-type diffused layer formed by injecting n-type impurity ions into a surface of a p-type bulk BUL. Alternatively, the back plane BP may be a $p^+$-type diffused layer formed by injecting p-type impurity ions into a surface of an n-type bulk BUL. This modification exhibit the same advantages as those of the second embodiment.

Needless to say, the back plane BP may be the $p^+$-type diffused layer formed by injecting p-type impurity ions into the surface of the p-type bulk BUL or the $n^+$-type diffused layer formed by injecting n-type impurity ions into the surface of the n-type bulk BUL.

THIRD EMBODIMENT

Figure 12:
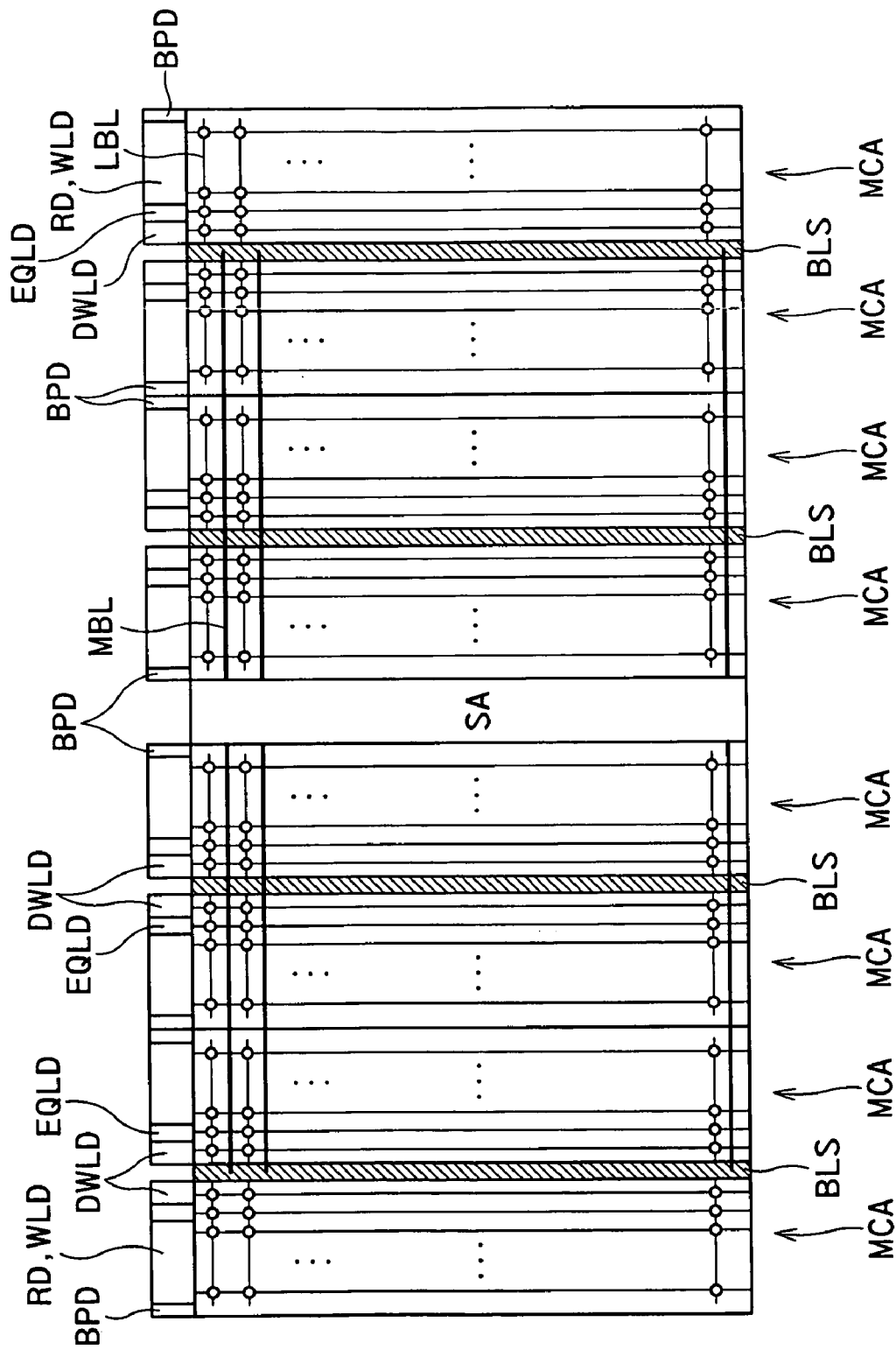
FIG. 12 is a plan view of a memory section 300 included in a semiconductor memory according to a third embodiment of the present invention.

FIG. 12 is a plan view of a memory section 300 included in a semiconductor memory according to a third embodiment of the present invention. In the memory section 300, the memory cell array MCA includes a sub-bit line SBL connected to memory cells MC's arranged in each column. This sub-bit line SBL is not directly connected to the sense amplifier SA, but connected thereto through a main bit line MBL.

The main bit line MBL is provided to correspond to a plurality of sub-bit lines SBL's, and connected to these sub-bit lines SBL's through a bit line switching circuit BLS. The bit line switching circuit BLS selects one of the sub-bit lines SBL's and connects the selected sub-bit line SBL to the main bit line MBL. The other constituent elements of the memory section 300 according to the third embodiment may be same as those of the memory section 200 according to the second embodiment.

The back plane BP may be provided per memory cell array MCA or may be provided to correspond to a group of several memory cells MC's in one memory cell array MCA. The modification of the second embodiment can be applied to the third embodiment. Further, the simulation results shown in FIGS. 5 and 6 can be similarly applied to the third embodiment. The third embodiment can, therefore, exhibit the same advantages as those of the second embodiment.

What is claimed is:

1. A semiconductor memory comprising:
a semiconductor substrate including a semiconductor film on a first insulating film;
a memory cell that stores data by charging or discharging a body region formed in said semiconductor film, the memory cell including a source layer on one side of said body region and a drain layer on another side of said body region;
a memory cell array in which a plurality of said memory cells are arranged in a matrix;
a second insulating film provided on said body region of said memory cell;
a first word line provided on said second insulating film;
a bit line connected to the drain layer of said memory cell, and having a reference potential when said memory cell is in a data retaining state;
a source line connected to the source layer of said memory cell, and having the reference potential; and
a second word line buried in said first insulating film, and provided below said body region of said memory cell, wherein
a potential $V_{BWLH}$ of said second word line when said memory cell is in the data retaining state is closer to said reference potential than a potential $V_{BWLL}$ of said second word line when a data read/write operation is executed.

2. The semiconductor memory according to claim 1, wherein the memory cell stores data by charging or discharging holes in the body region;
wherein the data retaining state is a state in which a potential of the first word line decreases to a level lower than the reference potential; and
wherein the data read/write operating state is a state in which the potential of the first word line increases to a level higher than the reference potential.

3. The semiconductor memory according to claim 1, wherein the memory cell stores data by charging or discharging holes in a body region;
wherein, when the memory cell transitions from the data retaining state to the data read/write operating state, the potential of the first word line increases to a level higher than the reference potential after the potential of the second word line decreases from $V_{BWLH}$ to $V_{BWLL}$;
wherein, when the memory cell transitions from the data read/write operating state to the data retaining state, the potential of the second word line increases from $V_{BWLL}$ to $V_{BWLH}$ after the potential of the first word line decreases to a level lower than the reference potential.

4. The semiconductor memory according to claim 2, wherein, when the memory cell transitions from the data retaining state to the data read/write operating state, the potential of the first word line increases to a level higher than the reference potential after the potential of the second word line decreases from $V_{BWLH}$ to $V_{BWLL}$;

wherein, when the memory cell transitions from the data read/write operating state to the data retaining state, the potential of the second word line increases from $V_{BWLL}$ to $V_{BWLH}$ after the potential of the first word line decreases to a level lower than the reference potential.

5. The semiconductor memory according to claim 1, wherein, when the memory cells arranged in a row are purged, the potential of the second word line is higher than $V_{BWLL}$.

6. The semiconductor memory according to claim 1, wherein, when the memory cells arranged in a row are purged during the data read/write operating state, the potential of the second word line increases from $V_{BWLL}$ to a higher potential than $V_{BWLL}$, while the first word line keeps a higher potential than the reference potential.

7. The semiconductor memory according to claim 1, wherein, when the memory cells along with the second word line are discharged, the potential of the second word line increases to a level higher than $V_{BWLL}$.

8. A semiconductor memory comprising:
a semiconductor substrate including a semiconductor film on a first insulating film;
a memory cell that stores data by charging or discharging a body region formed in said semiconductor film, the memory cell including a source layer on one side of said body region and a drain layer on another side of said body region;
a memory cell array in which a plurality of said memory cells are arranged in a matrix;
a second insulating film provided on said body region of said memory cell;
a word line provided on said second insulating film;
a bit line connected to the drain layer of said memory cell, and having a reference potential when said memory cell is in a data retaining state;
a source line connected to the source layer of said memory cell, and having the reference potential; and
a back gate electrode buried in the first insulating film, the back gate electrode being provided below the body region to spread over a plurality of the word lines and a plurality of the bit lines, wherein
a potential $V_{BWLH}$ of the back gate electrode when memory cells on the back gate electrode are in the data retaining state is closer to said reference potential than a potential $V_{BWLL}$ of the back gate electrode when the data read/write operation is executed on one of memory cells located over the back gate electrode.

9. The semiconductor memory according to claim 8, wherein the memory cell stores data by charging or discharging holes in a body region;
wherein the data retaining state is a state in which a potential of the word line decreases to a level lower than the reference potential;
wherein the data read/write operating state is a state in which the potential of the word line increases to a level higher than the reference potential.

10. The semiconductor memory according to claim 8, wherein, when the memory cells on the back gate electrode transition from the data retaining state to the data read/write operating state, the potential of the word line increases to a level higher than the reference potential after the potential of the back gate electrode decreases from $V_{BWLH}$ to $V_{BWLL}$;
wherein, when the memory cells on the back gate electrode transition from the data read/write operating state to the data retaining state, the potential of the back gate electrode increases from $V_{BWLL}$ to $V_{BWLH}$ after the potential of the word line decreases to a level lower than the reference potential.

11. The semiconductor memory according to claim 9, wherein, when the memory cells on the back gate electrode transition from the data retaining state to the data read/write operating state, the potential of the word line increases to a level higher than the reference potential after the potential of the back gate electrode decreases from $V_{BWLH}$ to $V_{BWLL}$;
wherein, when the memory cells on the back gate electrode transition from the data read/write operating state to the data retaining state, the potential of the second word line increases from $V_{BWLL}$ to $V_{BWLH}$ after the potential of the first word line decreases to a level lower than the reference potential.

12. The semiconductor memory according to claim 8, wherein, when the memory cells on the back gate electrode are purged, the potential of the back gate electrode is higher than $V_{BWLL}$.

13. The semiconductor memory according to claim 10, wherein, when memory cells on the back gate electrode are purged during the data read/write operating state, the potential of the back gate electrode increases from $V_{BWLL}$ to a higher potential than $V_{BWLL}$, while the word line keeps a higher potential than the reference potential.

14. The semiconductor memory according to claim 11, wherein, when memory cells on the back gate electrode are purged during the data read/write operating state, the potential of the back gate electrode increases from $V_{BWLL}$ to a higher potential than $V_{BWLL}$, while the word line keeps a higher potential than the reference potential.

15. The semiconductor memory according to claim 8 further comprising:
a sub-bit line connected to the memory cells arranged in a column of the memory cell array;
a main bit line capable of connecting electrically any one of a plurality of the sub-bit lines to the sense amplifier, selectively;
wherein the back gate electrode is provided for each cell array corresponding to each sub-bit line.

16. The semiconductor memory according to claim 8, wherein the back gate electrode is a high impurity concentration region provided in a boundary between the first insulating film and a semiconductor substrate below the first insulating film.

17. A driving method of an FBC memory cell, the FBC memory cell comprising: a body region formed in a SOI layer; a front gate electrode provided on a first insulating film formed on the body region; a back gate electrode buried in a second insulating film below the body region; a source layer formed on one side of said body region and a drain layer formed on another side of said body region;
the driving method comprising:
changing the potential of the back gate electrode to $V_{BWLL}$, when the FBC memory cell is in a data read/write operating state; and
changing the potential of the back gate electrode to $V_{BWLH}$, closer to a reference potential than a potential $V_{BWLL}$, when the FBC memory cell is in a data retaining state, the reference potential being a potential of the source or drain layer.

18. The driving method of a FBC memory cell according to claim 17, wherein the FBC memory cell stores data by charging or discharging holes in a body region;
wherein the data retaining state is a state in which the potential of the front gate electrode decreases to a level lower than the reference potential; and wherein the data read/write operating state is a state in which the potential of the front gate electrode increases to the reference potential.

19. The driving method of a FBC memory cell according to claim 17, wherein, when the FBC memory cell transitions from the data retaining state to the data read/write operating state, the potential of the front gate electrode increases to a level higher than the reference potential after the potential of the back gate electrode decreases from $V_{BWLH}$ to $V_{BWLL}$;

wherein, when the FBC memory cell transitions from the data read/write operating state to the data retaining state, the potential of the back gate electrode increases from $V_{BWLL}$ to $V_{BWLH}$ after the potential of the front gate electrode decreases to a level lower than the reference potential.

20. The driving method of a FBC memory cell according to claim 18, wherein, when the FBC memory cell transitions from the data retaining state to the data read/write operating state, the potential of the front gate electrode increases to a level higher than the reference potential after the potential of the back gate electrode decreases from $V_{BWLH}$ to $V_{BWLL}$;

wherein, when the FBC memory cell transitions from the data read/write operating state to the data retaining state, the potential of the back gate electrode increases from $V_{BWLL}$ to $V_{BWLH}$ after the potential of the front gate electrode decreases to a level lower than the reference potential.

* * * * *